United States Patent
Hayasaki et al.

(10) Patent No.: US 8,672,452 B2
(45) Date of Patent: Mar. 18, 2014

(54) LIQUID DISCHARGE HEAD AND CIRCUIT BOARD

(75) Inventors: Kimiyuki Hayasaki, Kawasaki (JP); Takamitsu Tokuda, Yokohama (JP); Kengo Umeda, Tokyo (JP); Nobuyuki Hirayama, Fujisawa (JP); Takaaki Yamaguchi, Yokohama (JP); Yoshiyuki Imanaka, Kawasaki (JP); Tatsuo Furukawa, Zama (JP)

(73) Assignee: Canon Kabushiki Kaisha, Tokyo (JP)

( * ) Notice: Subject to any disclaimer, the term of this patent is extended or adjusted under 35 U.S.C. 154(b) by 151 days.

(21) Appl. No.: 13/105,796

(22) Filed: May 11, 2011

(65) Prior Publication Data

US 2011/0285788 A1 Nov. 24, 2011

(30) Foreign Application Priority Data

May 19, 2010 (JP) ................................. 2010-115493

(51) Int. Cl.
*B41J 2/14* (2006.01)
*B41J 29/38* (2006.01)

(52) U.S. Cl.
USPC .................................. 347/44; 347/10; 347/50

(58) Field of Classification Search
USPC .......................................... 347/10, 44, 50, 58
See application file for complete search history.

(56) References Cited

U.S. PATENT DOCUMENTS 7,287,832 B2 * 10/2007 Hayasaki .......................... 347/50
2011/0254898 A1 * 10/2011 Muraoka et al. ................. 347/50

FOREIGN PATENT DOCUMENTS

JP 2005-199665 A 7/2005

* cited by examiner

*Primary Examiner* — Matthew Luu
*Assistant Examiner* — Renee I Wilson
(74) *Attorney, Agent, or Firm* — Canon USA Inc IP Division

(57) ABSTRACT

A liquid discharge head includes a liquid discharge head substrate including a discharge port through which a liquid is discharged, and a plurality of energy generating elements that generate energy for discharging the liquid from the discharge port, and a circuit board having flexibility including a pair of differential transmission lines for transmitting differential transmission signals used as logical signals for driving the energy generating elements, to the liquid discharge head substrate, and a voltage supply line for supplying a voltage applied to the energy generating elements to obtain the energy, to the liquid discharge head substrate, wherein the pair of differential transmission lines is provided on one surface of the circuit board, and the voltage supply line is provided on the other surface of the circuit board, which is on a reverse side of the one surface.

7 Claims, 8 Drawing Sheets

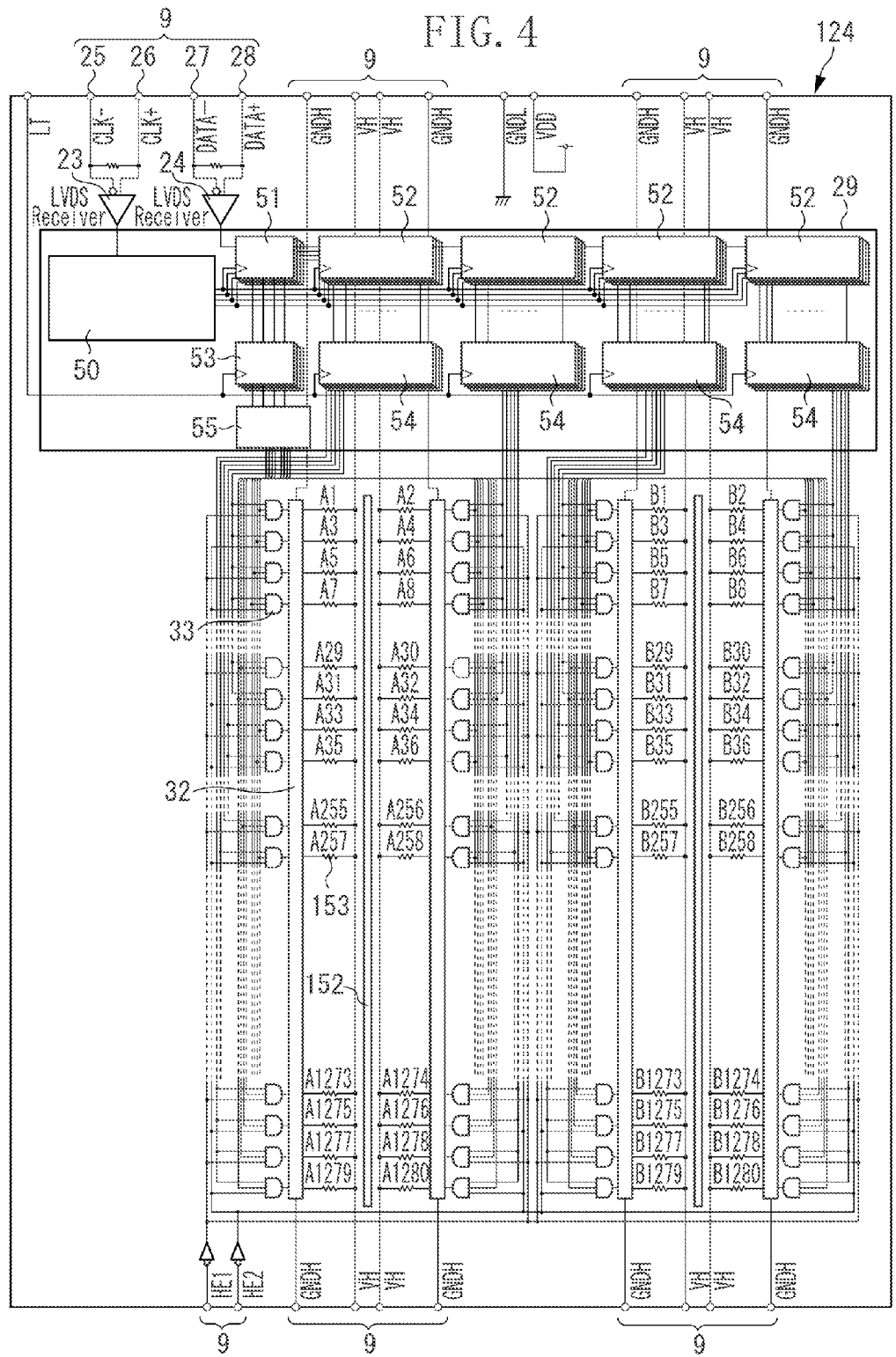

LIQUID DISCHARGE HEAD AND CIRCUIT BOARD

BACKGROUND OF THE INVENTION

1. Field of the Invention

The present invention relates to a liquid discharge head and a circuit board.

2. Description of the Related Art

A low voltage differential signal (LVDS) transmission scheme is one of differential transmission schemes as a data transfer scheme used in the field of precision equipment such as a liquid discharge apparatus. The LVDS transmission scheme is a scheme for transferring data using a pair of differential transmission lines, and is capable of transferring the data with much lower electric potential difference at a higher speed compared with a commonly used scheme for transferring data with a single line (hereinafter, referred to as a single-ended transmission scheme).

Japanese Patent Application Laid-Open No. 2005-199665 discusses a configuration for sending at high speeds using the LVDS transmission scheme, logical signals such as recorded data signals or clock signals for driving energy generating elements which generate energy for discharging a liquid. The signals are sent from the liquid discharge apparatus, via the differential transmission line within a circuit board (hereinafter, sometimes referred to as a flexible circuit board or a flexible board) made of a material provided in the liquid discharge head and having flexibility, to a liquid discharge head substrate including the energy generating elements.

However, a voltage required when the logical signals are transferred using the LVDS transmission scheme is smaller compared to a voltage utilized for energy generation from the energy generating elements. For this reason, even in the LVDS transmission scheme which is less susceptible to noises by taking differences of the signals between a pair of differential transmission lines, there is a possibility that a switching noise when voltage is applied to the energy generating elements may exert an influence upon transmission of the logical signals. For this reason, in a liquid discharge head discussed in Japanese Patent Application Laid-Open No. 2005-199665, there are concerns that transmission of the logical signals may not be normally performed under the influence of the switching noise, and operation may become unstable.

In the liquid discharge head that performs recording in a short time by discharging a liquid in unison from discharge ports of the liquid provided across a recording width of a recording medium, like the one used especially in the field of printing industry, a number of the energy generating elements to be simultaneously driven is increased. For this reason, it is conceivable that an electric current flowing through the flexible board also becomes large, and influence of the switching noise becomes noticeable. To reduce the influence of noises by keeping the differential transmission line used in the LVDS transmission scheme away from the line utilized for applying voltage for generation of energy, leads to an upsizing of the flexible board, and eventually to an upsizing of the apparatus, and therefore, that is not quite realistic.

SUMMARY OF THE INVENTION

The present invention is directed to providing a circuit board in which influence of noises when transfer of data is performed using the LVDS transmission scheme is reduced, while suppressing upsizing of the circuit board The present invention provides a liquid discharge head or a circuit board with a high reliability capable of reducing influence of noises when data transfer is performed using the LVDS transmission scheme, without upsizing the circuit board, by providing a pair of differential transmission lines on one side of the circuit board, and providing the voltage supply line on a side of the other face of the circuit board, in a circuit board having flexibility including a pair of differential transmission lines for transmitting differential transmission signals to the liquid discharge head substrate, and a voltage supply line for supplying voltage to be applied to the energy generating elements to the liquid discharge head substrate.

Further features and aspects of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the invention and, together with the description, serve to explain the principles of the invention.

FIG. 4 illustrates an example of a block diagram of lines of the liquid discharge head substrate.

DESCRIPTION OF THE EMBODIMENTS

Various exemplary embodiments, features, and aspects of the invention will be described in detail below with reference to the drawings.

"Record" used in the present specification means not only imparting an image having a meaning such as characters or graphics on a recording medium, but also imparting an image having no meaning such as patterns.

Furthermore, "ink" should be broadly interpreted, and refers to a liquid served in the formation of an image, a texture, a pattern or the like, which is imparted on a recording medium, processing of the recording medium, or treatment of the ink or the recording medium. In this case, treatment of the ink or recording medium, refers to, for example, improvement of fixing property, improvement of recording quality or coloring property, and improvement in image durability, due to coagulation or insolubilization of color materials contained in the ink to be imparted on the recording medium.

Figure 1A:
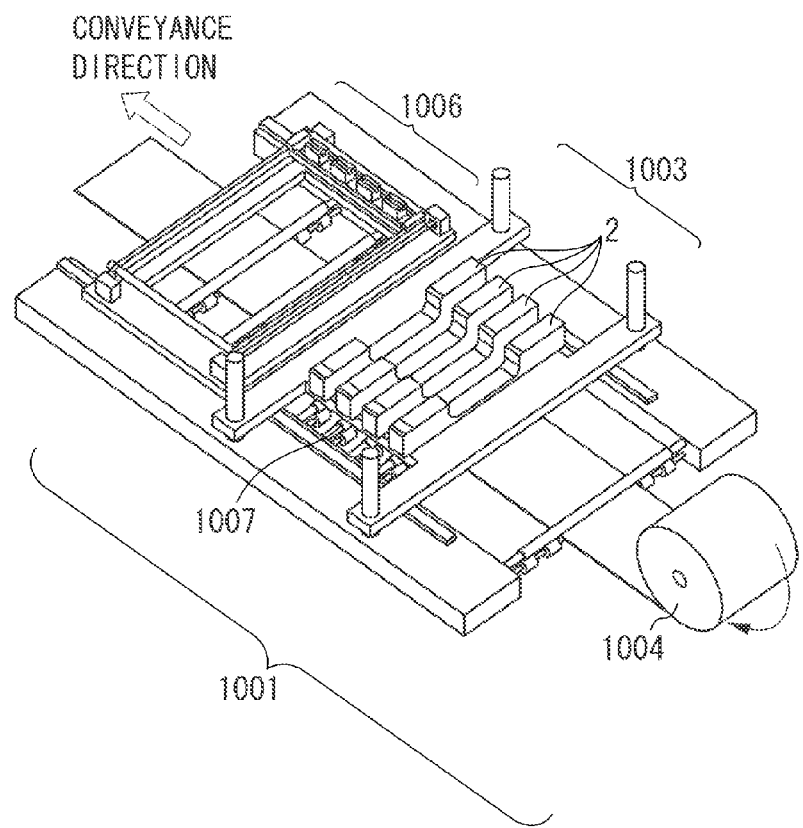
FIGS. 1A and 1B illustrate examples of schematically perspective views of a liquid discharge apparatus that can use a liquid discharge head.
Figure 1B:
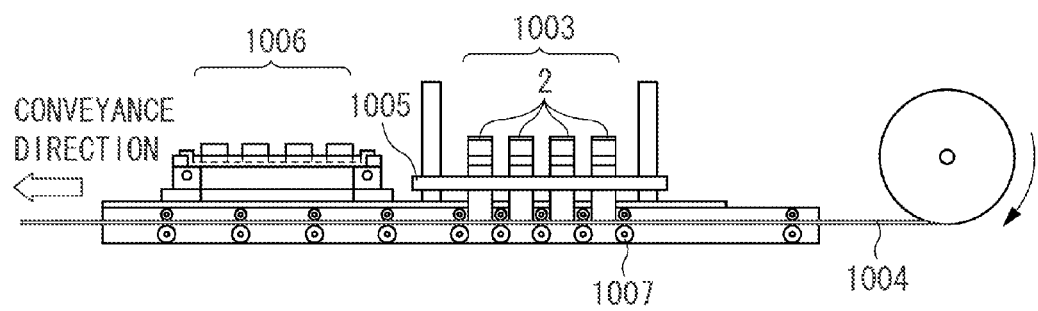

FIG. 1A is a perspective view illustrating a configuration of a main part centering on a recording unit of a liquid discharge apparatus 1001 according to an exemplary embodiment of the present invention. FIG. 1B is a cross-sectional view illustrating a cross-sectional structure in FIG. 1A. The recording apparatus according to the present exemplary embodiment is a line printer that performs printing using a line head of long lengths, while continuously conveying a sheet in a conveyance direction (first direction). The recording apparatus includes a holder for holding a sheet 1004 such as a continuous paper wound in the form of a roll, a conveying mechanism 1007 that conveys the sheet 1004 in the first direction at a predetermined speed, and a recording unit 1003 that performs recording with the line head on the sheet 1004. The sheet 1004 is not limited to a continuous roll sheet, but a cut sheet may be used. The liquid discharge apparatus 1 can further include a cleaning unit 1006 that cleans a nozzle surface of the liquid discharge head by wiping. Furthermore, the liquid discharge apparatus 1 includes a cutter unit that cuts the sheet 1004, a drying unit that forcibly dries the sheet, and a discharge tray, at downstream of the recording unit 1003 along a sheet conveyance path.

The recording unit 1003 includes a plurality of liquid discharge heads 2 each corresponding to different ink colors. In the present example, four liquid discharge heads 2 corresponding to four colors of CMYK are employed, but a number of colors is not limited to this. The ink for each color is supplied from an ink tank (not illustrated) via an ink tube to each of the liquid discharge heads 2. The plurality of liquid discharge heads 2 is held integrally by a head holder 1005, and the head holder 1005 can be moved up and down so that a distance between the plurality of liquid discharge heads 2 and the surface of the sheet 1004 can be changed.

Figure 2A:
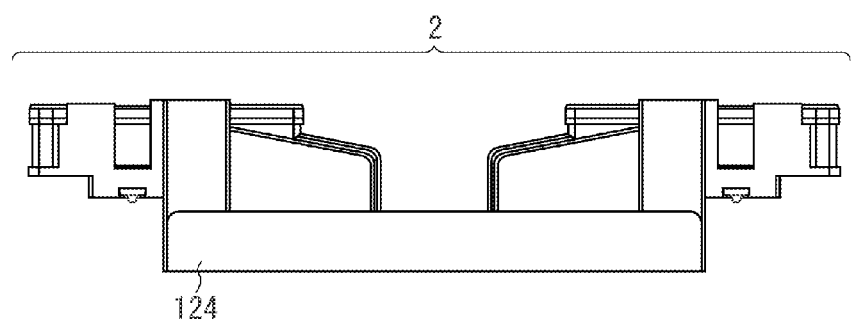
FIGS. 2A, 2B, and 2C illustrate examples of schematic views of the liquid discharge head.

FIG. 2 illustrates a structure of one liquid discharge head 2. The energy generating elements which generate energy for discharging a liquid which can be used for the liquid discharge head according to the present invention can employ a scheme using heating elements, a scheme using piezoelectric elements, a scheme using electrostatic elements, a scheme using micro electro machinery systems (MEMS) elements or the like. In the present case, description will be given taking the heating elements as an example.

Figure 2B:
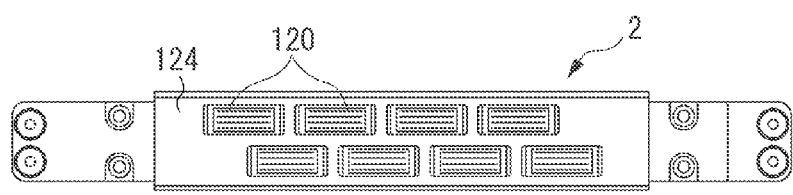

The liquid discharge head 2 is a line type liquid discharge head in which a discharge port array of an inkjet scheme is formed in a range to cover a maximum width of a sheet assumed to be used. An alignment direction of the discharge port array is a direction (second direction) intersecting with a first direction, for example, an orthogonal direction. On a large supporting substrate 124, a plurality of liquid discharge head substrates 120 are aligned along the second direction. As illustrated in FIG. 2B, a plurality of (eight pieces in the present example) liquid discharge head substrates 120 with identical dimensions and identical structure is formed over the full range in a width direction regularly in a staggered arrangement of two rows. More specifically, the liquid discharge heads 2 are configured such that a plurality of first liquid discharge head substrates and a plurality of second liquid discharge head substrates each having the discharge port array are aligned along the second direction as different rows. Furthermore, the first liquid discharge head substrates and the second liquid discharge head substrates adjacent to each other are in a deviated positional relation in the second direction. The first liquid discharge head substrates and the second liquid discharge head substrates adjacent to each other are provided so that parts of the discharge port array included in these heads are overlapping with each other in the second direction.

Figure 3:
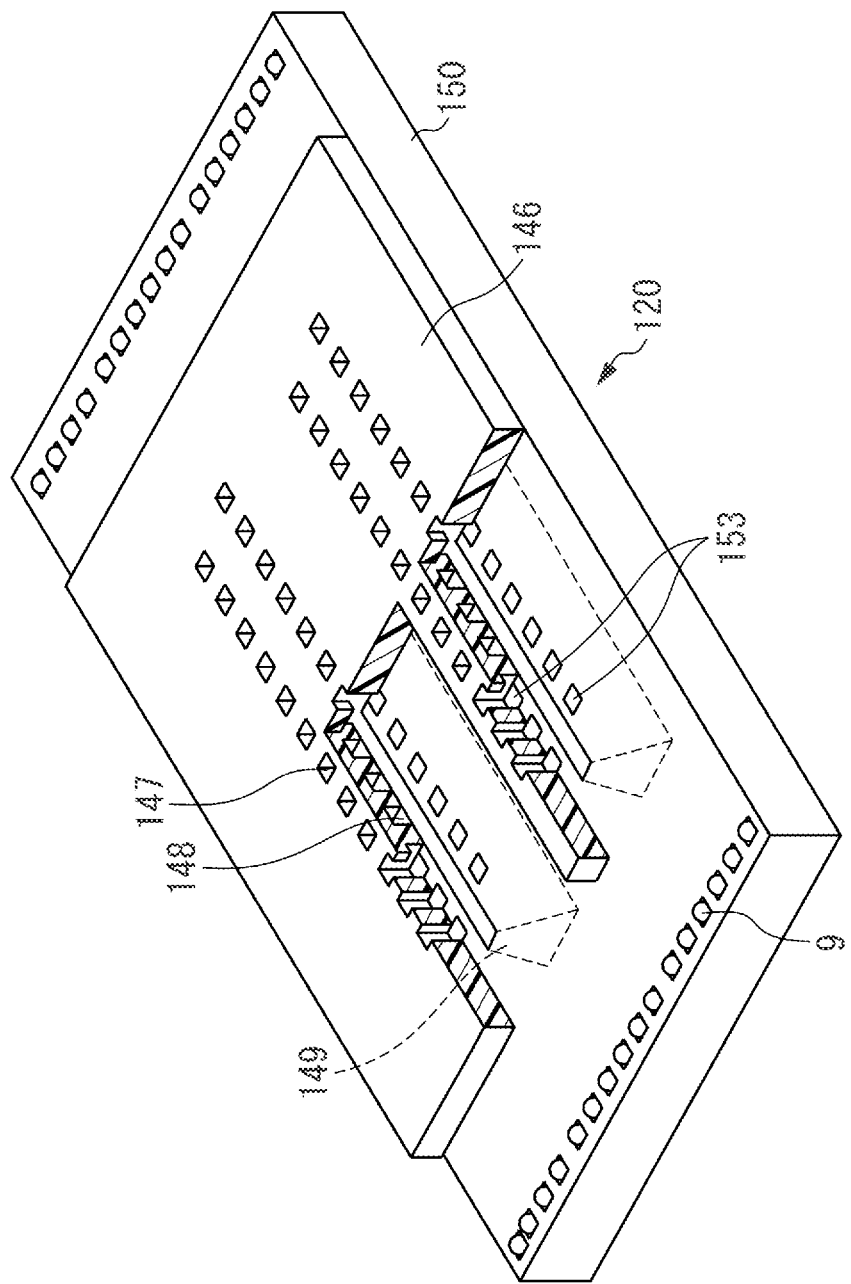
FIG. 3 illustrates an example of a schematic view of the liquid discharge head substrate.

FIG. 3 is an example of a schematically perspective view of a liquid discharge head substrate that can be used for the liquid discharge head 2 according to the present invention. The liquid discharge head substrate 120 has a base substrate 150 provided with energy generating elements 153, and a flow path forming member 146 provided in contact with the base substrate 150. On the base substrate 150, supply ports 149 for supplying a liquid are provided to penetrate the base substrate 150. On both sides of the supply port 149, provided is an element array in which a plurality of energy generating elements 153 is aligned in one row. In the present case, although description is given using the liquid discharge head substrate 120 on which the supply ports 149 are provided in two rows, the supply ports 149 in two or more rows can be also provided. At end portions of the base substrate 150, a plurality of pads 9 for supplying logical signals or power supply potentials to be used for driving the energy generating elements 153 is provided. In the present case, an example is illustrated in which the supply ports 149 in two rows are provided.

The flow path forming member 146 has the discharge ports 147 that can discharge the liquid using energy generated by the energy generating elements 153, at a position opposed to each of the energy generating elements 153. The flow path forming member 146 further has a portion 148a which becomes faces of flow paths 148 communicating the discharge ports 147 with the supply ports 149, and the flow paths 148 are configured by coming into contact with the substrate 150.

FIG. 4 is a block diagram of lines of the liquid discharge head substrate 120. The liquid discharge head substrate 120 has LVDS receivers 23 and 24 for receiving differential transmission signals (hereinafter, sometimes referred to as an LVDS transmission signal). A terminal 25 (CLK−) and a terminal 26 (CLK+) used for inputting clock signals composed of the differential transmission signals are connected to the LVDS receiver 23. Furthermore, a terminal 27 (DATA−) and a terminal 28 (DATA+) used for inputting image data composed of the differential transmission signals for driving the energy generating elements 153 are connected to the LVDS receiver 24. A recorded signal for selecting and driving a switching element of a region 32 made of metal oxide semiconductor field effect transistor (MOS-FET) arranged on the liquid discharge head substrate 120 can be transferred at high speeds by the two LVDS receivers.

The LVDS receivers 23 and 24 rasterizes data of the logical signals such as the clock signals or the recorded signals input from terminals 25, 26, 27, and 28, and are connected to a drive control circuit 29 which internally performs parallel processing. A synchronous clock generation circuit 50 provided in the drive control circuit 29 can divide frequency of the CLK signals output from the LVDS receiver 23. The LVDS receiver 24 can convert serial signals input from the terminals 27 and 28 into recorded data signals and block control signals corresponding to respective element arrays.

The block control data signals are sent to a shift register circuit 51 connected to a decoder circuit 55 via a latch circuit 53, and the recorded data signals are sent to the shift register circuit 52. When an LT signal is further input, the block control data which has been retained in the shift register, is retained by the latch circuit 53 connected to the decoder circuit 55, and the recorded data signals are retained in the latch circuit 54. The block control data signals output from the latch circuit 53 are input into the decoder circuit 55, and are output as block selection signals for selecting blocks of the energy generating elements 153 to be driven, and for performing time-division drive. This block selection signals and the recorded data signals are ANDed by an AND circuit 33, thereby enabling to select the energy generating element 153 to be driven. Furthermore, the selection signals output from the AND circuit 33 are sent to the switching element such as metal oxide semiconductor field effect transistor (MOS-FET) provided in the region 32 for driving the energy generating elements 153. The switching elements can discharge the liquid from the discharge ports by applying drive voltage to the energy generating elements 153 according to the selection signal. With the use of the LVDS transmission scheme as described above, the switching elements can send image data four times as much as compared with other conventional LVDS transmission scheme, and can perform discharge operation at high speeds.

On the liquid discharge head substrate 120, a power supply line (hereinafter, sometimes referred to as a VH line) for applying drive voltage for driving the energy generating elements 153 and their grounding lines (hereinafter, sometimes referred to as a GNDH line) are provided, and are connected to the pads 9.

Figure 2C:
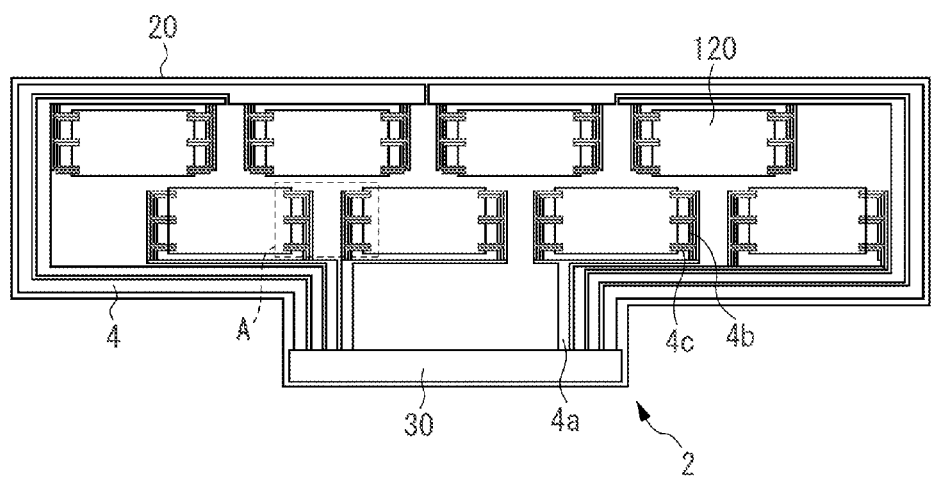
Figure 6A:
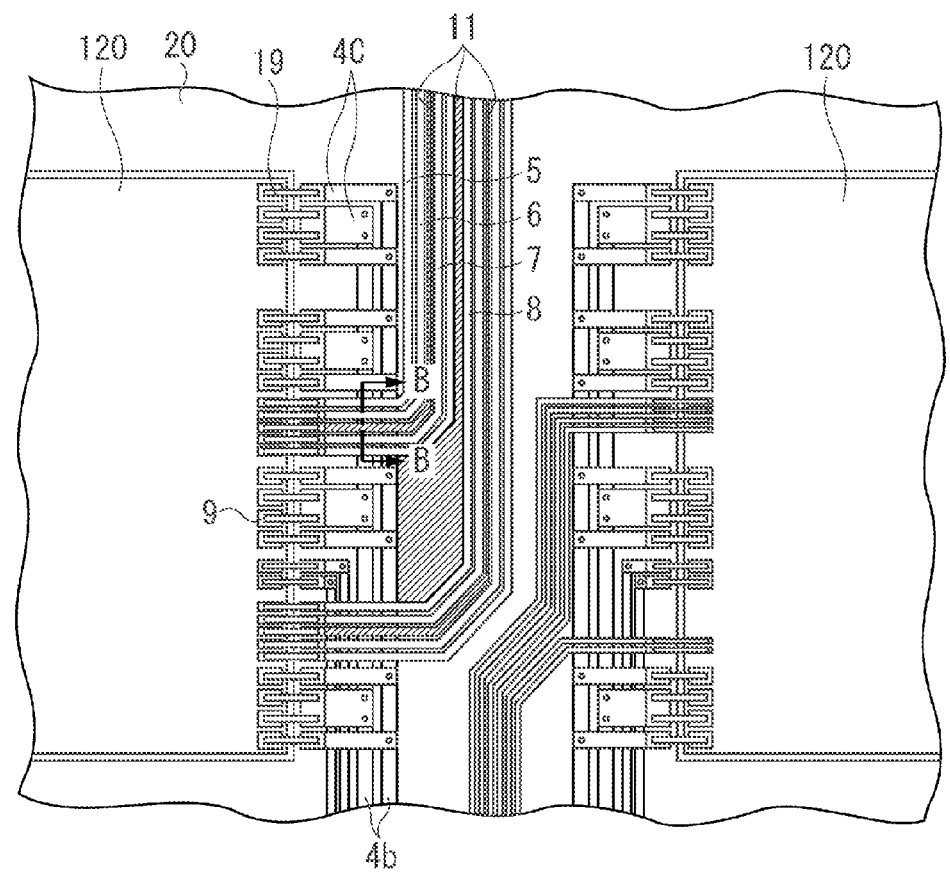
FIGS. 6A and 6B illustrate examples of a portion of the liquid discharge head.

FIG. 2C illustrates a schematic view, before the plurality of liquid discharge head substrates 120, and a flexible circuit board 20 (circuit board) formed of a material having flexibility which connects the liquid discharge head substrate and the liquid discharge apparatus, are connected to the supporting substrate 124 of the liquid discharge head. FIG. 6A illustrates an example of a region "A" of the flexible circuit board 20 of the liquid discharge head illustrated in FIG. 2C.

The flexible circuit board 20 used as a circuit board is provided to surround the peripheries of the respective liquid discharge head substrates 120. The differential transmission line (hereinafter, sometimes referred to as an LVDS line) for sending an LVDS transmission signal such as a logical signal, for example, a clock signal or a data signal, and a voltage supply line 4 such as a power supply line and a grounding line are provided therein. Furthermore, a contact portion 30 for connecting the differential transmission line and the voltage supply line 4 with the liquid discharge apparatus is provided therein. The differential transmission line and the voltage supply line 4 are connected to the pads 9 of the liquid discharge head substrate 120, thereby logical signals and power supply voltages are supplied from the liquid discharge apparatus 1 to the liquid discharge head substrate 120. The pads 9 of the liquid discharge head substrate 120 and the flexible circuit board 20 are connected with a thin line 19 made of gold or the like (wire bonding). Furthermore, a top side of the line 19 is sealed with a member made of resin so that the ink does not come into contact therewith (not illustrated).

As the circuit board, the liquid discharge head substrate and the liquid discharge apparatus can be electrically connected to each other using a multilayered substrate by laminating a plurality of alumina substrates. However, inexpensive and highly reliable liquid discharge head in which electrical connection is surely performed by using a film-like pliant flexible circuit board, can be also provided. In addition, a liquid discharge head with much higher reliability can be provided by forming an insulator of the flexible circuit board using a material which is not corroded even if a liquid like the ink would come into contact therewith.

The flexible circuit board 20 is a two-sided flexible circuit board 20 in which a differential signal line is provided on its surface (one side), and the voltage supply line 4 on its rear surface (the other side). An area of the flexible circuit board can be reduced, and the compact liquid discharge apparatus can be provided by thus providing the lines on two sides.

The voltage supply line 4 for applying a drive voltage is provided to cause a master line portion 4a which connects the contact portion 30 and one liquid discharge head substrate 120, to branch to two semi-master line portions 4b for connecting to both ends of the liquid discharge head substrate 120. Furthermore, the semi-master line portions 4b are provided to branch to the divided line portions 4c for establishing connection for each element array. FIG. 2C illustrates an example in which the liquid discharge head substrate 120 having two rows of the supply ports 149 is used for the liquid discharge head.

All currents for driving one liquid discharge head substrate 120 flow through the master line portion 4a, and one half of the current flowing through the master line portion 4a flows through each of the semi-master line portions 4b. Furthermore, in a case where the element arrays are provided on both sides of two rows of the supply ports 149, one quarter of the current flowing through the semi-master line portion 4b flows through the divided line portions 4c. In other words, since the divided line portions 4b are provided to allow a current of the order of 1 A at maximum to flow therethrough, a current of a maximum of about 4 A flows through the semi-master line portions 4b in a configuration in which four rows of the supply ports 149 are provided, and a current of a maximum of about 8 A flows through the master line portions 4a.

Figure 5A:
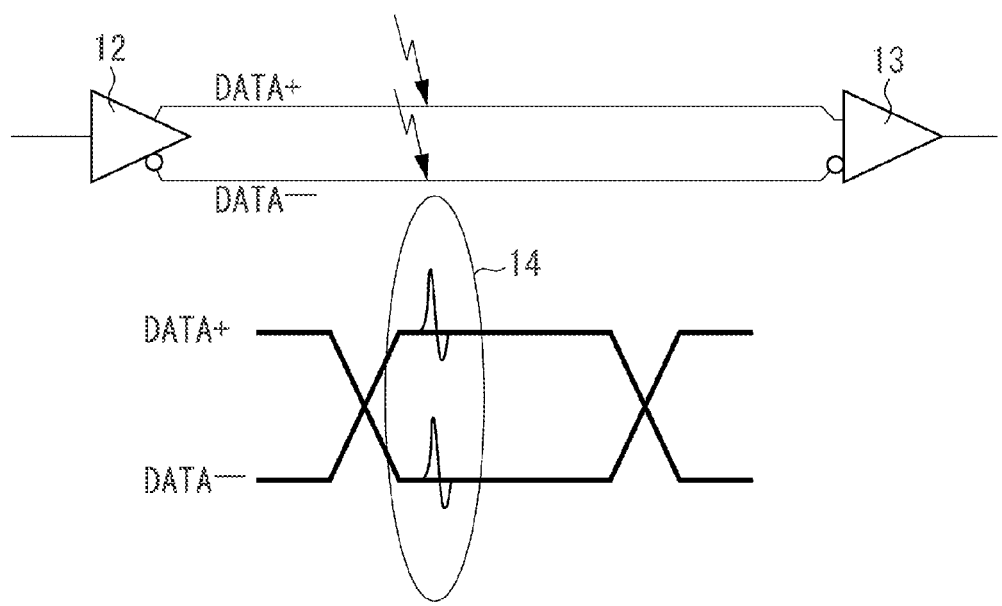
FIGS. 5A and 5B are views explaining influence of noises in a single-ended transmission scheme and an LVDS transmission scheme.
Figure 5B:
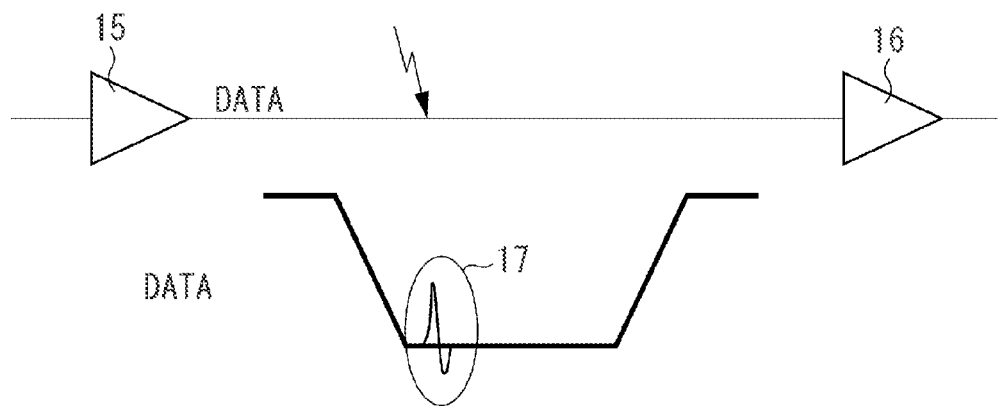

Next, influence of noises in the LVDS transmission scheme, and the conventional single-ended transmission scheme will be described. FIG. 5A illustrates influence of noises in the LVDS transmission scheme. FIG. 5B illustrates influence of normal-mode noise in the single-ended transmission scheme. In the liquid discharge head, the logical signal line and the power supply line for supplying driving potentials for driving the energy generating elements and the grounding line are provided. For this reason, the noises will be generated by the influence of induced electromotive forces caused by fluctuations of current values associated with ON-OFF of the energy generating elements.

The influences of noises in the conventional single-ended transmission scheme will be described. A large-sized liquid discharge head in which several thousands of the energy generating elements are arranged, includes a control circuit of the energy generating elements which allows a large current to flow therethrough, and further includes a logical gate circuit unit such as a complementary metal oxide semiconductor (CMOS) transistor or a transistor-transistor logic (TTL) circuit.

When a noise 17 is generated during transmission between a driver 15 and a receiver 16, as illustrated in FIG. 5B, the noise will be transmitted together with the signal. An induced electromotive force E [V] caused by a noise is expressed as E=−L (di/dt), assuming a self-inductance of line "L" to be 100 [nH], a rise time "t" for passage of current through energy generating elements subjected to pulse driving to be 100 [nsec], and a concentrated current "i" which flows therethrough at this time to be approximately 1 [A]. As a result of this calculation, an induced voltage of equal to or greater than 1 [V] will be produced as the noise. When the noise 17 becomes equal to or greater than a threshold voltage level, there is a possibility that recording operation may be performed at a wrong timing by the noise 17. In a case where the logical signal is transmitted at a voltage of approximately e.g., 3.3 [V], if the noise by the induced voltage becomes approximately 1 [V], it is possible that it might cause a wrong operation.

While an electric potential difference to be used in the single-ended transmission scheme is approximately 3.3 V, an electric potential difference to be used in the LVDS transmission scheme is approximately 350 mV, which is much smaller compared to the single-ended transmission scheme. Since such a small electric potential difference can be used, the LVDS transmission scheme can send data at higher speeds compared to the single-ended transmission scheme.

Next, influence of the noise 14 in the LVDS transmission scheme will be described. High-speed data issued from an LVDS driver 12 of the recording apparatus is transmitted through a pair of differential transmission lines used as a logical signal line, and sent to the LVDS receiver 13 of the liquid discharge head substrate. In such LVDS transmission scheme, data is obtained by taking a difference between voltages of signals transmitted via the pair of differential transmission lines. As a result, even when similar noises 14 are generated on two lines, they are cancelled out, thereby no noises remain in the data. Noises are generated in the one DATA+ (first LVDS line), and the other DATA− (second LVDS line) of the pair of differential transmission lines in FIG. 5A. In the LVDS receiver 13, however, it is determined based on a difference between the DATA+ and DATA−, and accordingly the influence of noises can be neglected. Therefore, data can be transmitted without receiving influence from normal-mode noise, as in the case with common-mode noise. In such VLDS transmission line, it is preferable that the DATA+ line and DATA− line are provided at adjacent positions to each other. The DATA+ line and DATA− line are influenced by the induced voltage of nearly same magnitude since they are provided at adjacent positions. Accordingly, the influence of noises can be surely reduced by taking a difference between the voltages. In the flexible circuit board, it is preferable that the DATA+ line and DATA− line are provided adjacent to each other having a width of about 80 μm.

In the flexible circuit board 20 as illustrated in FIG. 6A, a CLK signal and a DATA signal using the LVDS transmission scheme, and the voltage supply line for supplying electric power to the energy generating elements are used. In the flexible circuit board 20, a first CLK signal line 5 (one) and a second CLK signal line 6 (the other) are provided adjacent to each other as a pair. Furthermore, the first DATA signal line 7 and the second DATA signal line 8 using the LVDS transmission scheme are provided adjacent to each other as a pair.

The lines using the LVDS transmission scheme and the semi-master line portions 4b of the voltage supply line are provided to intersect with each other. The first CLK signal line 5 and the first DATA signal line 7 are referred to as a first LVDS line (DATA+), and the second CLK signal line 6 and the second DATA signal line 8 are referred to as a second LVDS line (DATA).

The flexible circuit board 20 is provided such that an area at which the first LVDS line and the semi-master line portions 4b overlap (intersect) with each other, and an area at which the second LVDS line and the semi-master line portions 4b overlap (intersect) with each other are equal to each other. In this configuration, magnitudes of the noises of induced electromotive forces caused by a current which exerts influence upon the first LVDS line and the second LVDS line which are paired with each other, and flows through the semi-master line portions 4b, become equal. Accordingly, the influence of generated noises on data signals can be reduced by taking differences between data of the first LVDS line and data of the second LVDS line. Influence of additional noises can be reduced by decreasing a current flowing through the semi-master line portions 4b in intersecting portion. It is preferable that a portion of the semi-master line portion 4a through which minimal current flows, since the semi-master line portions 4b illustrated in FIG. 6A branch to three divided line portions 4c, and a pair of the LVDS lines overlap with each other.

Additionally, it is preferable to provide a guard line 11 between a pair of the LVDS lines 5 and 6 used as the CLK signal line, and a pair of the LVDS lines 7 and 8 used as the DATA signal line. By providing such a guard line 11, noises from other LVDS lines can be reduced. The guard line is connected to a grounding terminal of the LVDS receiver 13, thereby the guard line can be kept at a ground potential. Furthermore, in a case where there is also a surplus region in the flexible circuit board 20, the noises can be reduced owing to the guard line. Furthermore, the pads for guard pattern can be employed for the pads 9 of the liquid discharge head substrate 120.

In a case where the LVDS line and the voltage supply line through which relatively large current flows are provided in parallel, the magnitudes of the induced electromotive forces which affect two LVDS lines are different, and also it is possible that the noises cannot be removed when differences are taken, and thus it is preferable to provide the two LVDS lines as spaced as possible from each other. More specifically, when a portion of the semi-master line 4b connected to three divided line portions 4c, and a portion of the semi-master line 4b connected to two divided line portions 4c are compared with each other, the two semi-master line portions 4b connected to the two divided line portions 4c are provided closer to the LVDS line.

Figure 6B:
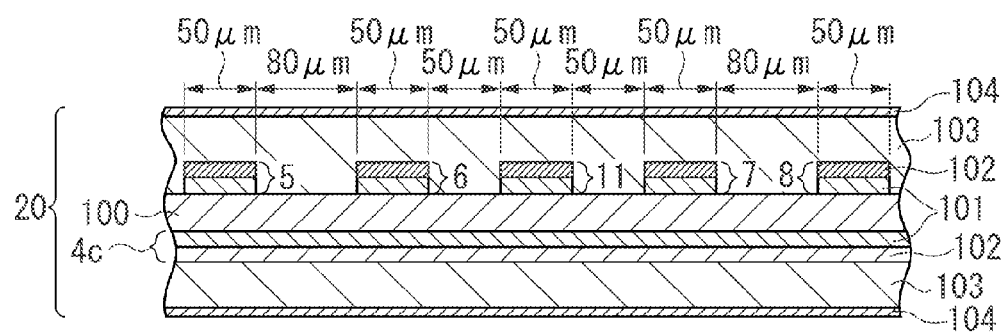

FIG. 6B illustrates a cross-sectional view "B" of the flexible circuit board 20 of such a liquid discharge head, and is a cross-sectional configuration of a portion at which the LVDS line and the voltage supply line intersect each other. On the flexible circuit board 20, the LVDS line made of copper is provided on a surface of a base material 100 formed of an insulating material with a thickness of about 30 μm, and the voltage supply line formed of copper is provided on a rear surface. These lines are made by providing a copper foil 101 with a thickness of about 3 to 5 μm, and furthermore, using the copper foil 101 as a seed layer and causing the copper with a thickness of about 3 to 5 μm to be deposited thereon by a plating process. The lines formed of such copper are covered with coverlay adhesive 103 with a thickness of approximately 30 to 50 μm. Furthermore, a cladding portion 104 with a thickness of 3 to 5 μm is provided thereon. The LVDS lines have a width of about 50 μm in a direction parallel to the surface of the flexible circuit board 20. The first CLK signal line 5 and the second CLK signal line 6 are provided with about 80 μm spacing, and likewise the first DATA signal line 7 and the second DATA signal line 8 are provided with about 80 μm spacing. Also, the guard line 11 is provided using a copper line between the second CLK signal line 6 and the first DATA signal line 7, in order to prevent mutual interference between the CLK signal line and the DATA signal line. The noises can be reduced by thus providing the guard line 11. When such an LVDS scheme is used, it is preferable to provide the lines, whose characteristic impedances are always about 100Ω.

As described above, an area of the flexible circuit board 20 can be reduced by providing the LVDS lines and the voltage supply line on both sides of the flexible circuit board 20 via a base material 100. Further, by providing the LVDS lines and the voltage supply line via the base material 100 formed of an insulating material, the influence of induced electromotive forces on the LVDS lines by the voltage supply line can be reduced.

Furthermore, an area in which the first LVDS line 5 and 7 and the voltage supply line 4 for supplying the driving voltage are laminated, and an area in which the second LVDS lines 6 and 8 and the voltage supply line 4 are laminated, are equal to each other, so that the magnitudes of the noises of the induced electromotive forces can be equalized. Accordingly, the noises are cancelled out when differences are taken, and influence of noises can be removed from the data, and thus recording operation with a high reliability can be performed.

Figure 7A:
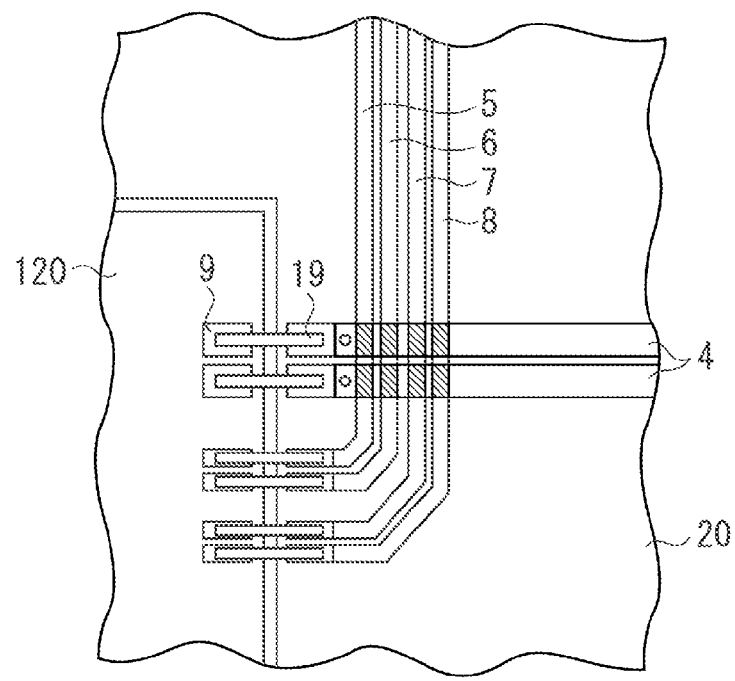
FIGS. 7A and 7B illustrate examples of a portion at which a differential transmission line and a voltage supply line intersect each other.
Figure 7B:
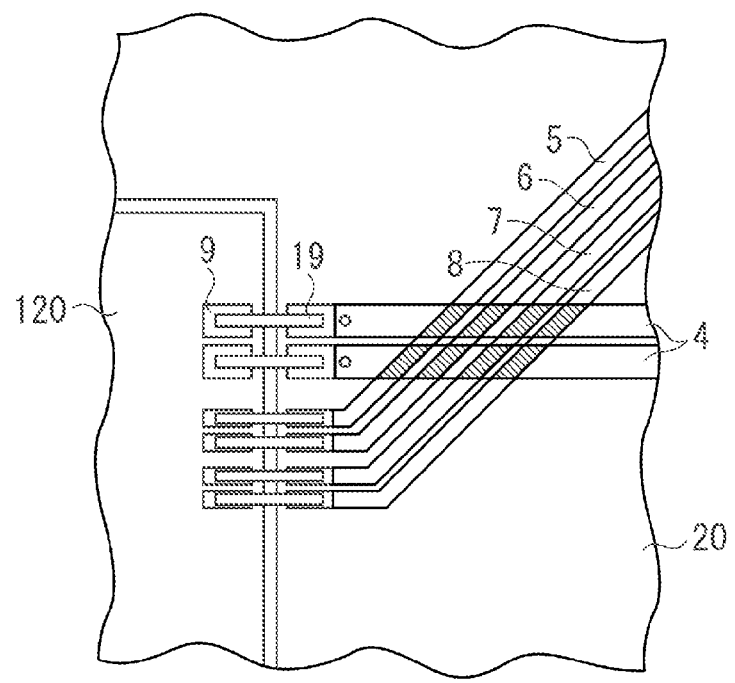

The areas can be made equal not only by causing the voltage supply line to intersect with the LVDS lines at right angles as illustrated in FIG. 7A, but also to intersect in an oblique state as illustrated in FIG. 7B.

Figure 8:
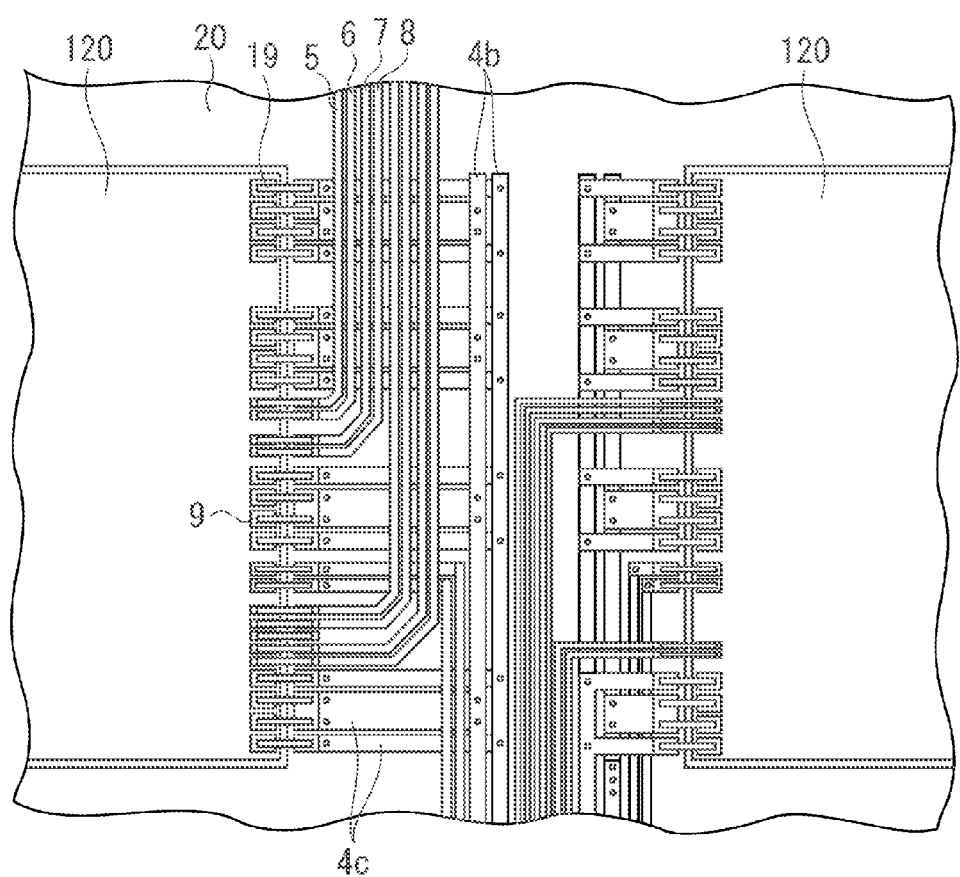
FIG. 8 illustrates an example of a portion of the liquid discharge head.

Next, another example of a portion at which the voltage supply line intersects with the pair of the LVDS lines will be described. FIG. 8 illustrates an example of the region "A" of the flexible circuit board 20 of the liquid discharge head illustrated in FIG. 2C. The divided line portions 4b further branching from the semi-master line 4a intersect with the LVDS lines. Only the current supplied to two rows of element arrays provided adjacent to the supply port 149 flows through the divided line portions 4C, and the magnitudes of the induced electromotive forces can be made even smaller compared with a case where the semi-master line portion 4a intersects with the LVDS lines.

By cancelling out the noises by taking differences between the data of the first LVDS line and the data of the second LVDS line, the influence of noises can be removed from the data, and thus recording operation can be carried out with a high reliability.

Also in the present exemplary embodiment, the noises can be reduced by providing the guard line between the adjoining LVDS lines.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures, and functions.

This application claims priority from Japanese Patent Application No. 2010-115493 filed May 19, 2010, which is hereby incorporated by reference herein in its entirety.

What is claimed is:

1. A liquid discharge head comprising:
a liquid discharge head substrate including a discharge port through which a liquid is discharged, and a plurality of energy generating elements that generate energy for discharging the liquid from the discharge port; and
a circuit board having flexibility including a pair of differential transmission lines for transmitting differential transmission signals used as logical signals for driving the energy generating elements, to the liquid discharge head substrate, a voltage supply line for supplying a voltage applied to the energy generating elements to obtain the energy, to the liquid discharge head substrate, and a base,
wherein the pair of differential transmission lines is provided on one surface of the base, and the voltage supply line is provided on a reverse side of the one surface of the base.

2. The liquid discharge head according to claim 1, wherein the base is made of an insulating material.

3. The liquid discharge head according to claim 1, wherein, as viewed from a direction perpendicular to the one surface of the base, the pair of differential transmission lines intersects with the voltage supply line.

4. The liquid discharge head according to claim 3, wherein an area of a portion at which one of the pair of differential transmission lines intersects with the voltage supply line, and an area of a portion at which the other of the pair of differential transmission line intersects with the voltage supply line are virtually equal to each other.

5. The liquid discharge head according to claim 4, wherein the one of the pair of differential transmission lines and the other of the pair of differential transmission lines are arranged along each other.

6. A liquid discharging head comprising:
a liquid discharge head substrate including a discharge port through which a liquid is discharged, and a plurality of energy generating element that generate energy for discharging the liquid from the discharge port; and
a circuit board having flexibility including a pair of differential transmission lines for transmitting differential transmission signals used as logical signals for driving the energy generating elements, to the liquid discharge head substrate, a voltage supply line for supplying a voltage applied to the energy generating elements to obtain the energy, to the liquid discharge head substrate, and a base material made of an insulating material,
wherein the pair of differential transmission lines is provided on one surface of the base material and the voltage supply line is provided on a reverse side of the one surface of the base material, and
wherein, as viewed from a direction perpendicular to the one surface of the base material, the pair of differential transmission lines intersects the voltage supply line.

7. The liquid discharge head according to claim 6, wherein an area of a portion at which one of the pair of differential transmission lines intersects with the voltage supply line, and an area of a portion at which the other of the pair of differential transmission line intersects with the voltage supply line are virtually equal to each other.

* * * * *